US007809535B2

(12) United States Patent
Bowers

(10) Patent No.: US 7,809,535 B2
(45) Date of Patent: Oct. 5, 2010

(54) NUMERICAL TECHNIQUES FOR DYNAMICS SIMULATION

(75) Inventor: Kevin J. Bowers, Bridgewater, NJ (US)

(73) Assignee: D. E. Shaw Research, LLC, New York, NY (US)

( * ) Notice: Subject to any disclaimer, the term of this patent is extended or adjusted under 35 U.S.C. 154(b) by 490 days.

(21) Appl. No.: 11/865,298

(22) Filed: Oct. 1, 2007

(65) Prior Publication Data
US 2008/0082303 A1 Apr. 3, 2008

Related U.S. Application Data

(60) Provisional application No. 60/827,547, filed on Sep. 29, 2006.

(51) Int. Cl.
*G06F 17/50* (2006.01)
*G06G 7/48* (2006.01)
(52) U.S. Cl. .................. 703/2; 703/7; 345/419
(58) Field of Classification Search .................. 703/2, 703/7–9; 708/490, 495; 345/419
See application file for complete search history.

(56) References Cited

U.S. PATENT DOCUMENTS

| 7,610,182 | B2 * | 10/2009 | Smith et al. ............. 703/2 |
| 2005/0065990 | A1 * | 3/2005 | Allen .................. 708/495 |
| 2005/0273483 | A1 * | 12/2005 | Dent .................. 708/490 |
| 2006/0262114 | A1 * | 11/2006 | Leprevost ............. 345/419 |

OTHER PUBLICATIONS

G. Almasi, C. Archer, J. G. Castanos, et al., Design and Implementation of Message-Passing Services for the Blue Gene/L Supercomputer, *IBM J. Res. & Dev.*, 49(2-3): 393-406, 2005.
I. T. Arkin, H. Xu, K. J. Bowers, et al., Mechanism of a Na+/H+ Antiporter, submitted, 2006.
K. J. Bowers, Speed Optimal Implementation of a Fully Relativistic 3D Particle Push with a Charge Conserving Current Accumulate on Modern Processors, presented at 18th International Conference on the Numerical Simulation of Plasmas, Cape Cod, MA, 2003.
K. J. Bowers, R. O. Dror, and D. E. Shaw, Overview of Neutral Territory Methods for the Parallel Evaluation of Pairwise Particle Interactions, *J Phys. Conf. Ser.*, 16: 300-304, 2005.
K. J. Bowers, R. O. Dror, and D. E. Shaw, The Midpoint Method for Parallelization of Particle Simulations, *J. Chem. Phys.*, 124: 184109, 2006.
K. J. Bowers, R. O. Dror, and D. E. Shaw, Zonal Methods for the Parallel Execution of Range-Limited N-Body Problems, in press, *J. Comput. Phys.*, 2006.
B. R. Brooks, R. E. Bruccoleri, B. D. Olafson, et al., CHARMM: A Program for Macromolecular Energy, Minimization, and Dynamics Calculations, *J. Comput. Chem.*, 4: 187-217, 1983.
C. L. Brooks, B. M. Pettit, and M. Karplus, Structural and Energetic Effects of Truncating Long Ranged Interactions in Ionic and Polar Fluids, *J. Chem. Phys.*, 83(11): 5897-5908, 1985.

F. Cappello and D. Etiemble, MPI Versus MPI+OpenMP on the IBM SP for the NAS Benchmarks, presented at ACM/IEEE SC2000 Conference, Dallas, TX, 2000.
D. A. Case, T. E. Cheatham, III, T. Darden, et al., The Amber Biomolecular Simulation Programs, *J. Comput. Chem.*, 26(16): 1668-1688, 2005.
E. Chow and D. Hysom, Assessing Performance of Hybrid MPI/OpenMP Programs on SMP Clusters, Lawrence Livermore National Laboratory UCRL-JC-143957, 2001.
T. Darden, D. York, and L. Pedersen, Particle Mesh Ewald: An N Log(N) Method for Ewald Sums in Large Systems, *J. Chem. Phys.*, 98(12): 10089-10092, 1993.
Y. Duan and P. A. Kollman, Pathways to a Protein Folding Intermediate Observed in a 1-Microsecond Simulation in Aqueous Solution, *Science*, 282(5389): 740-744, 1998.
M. Eleftheriou, B. G. Fitch, A. Rayshubskiy, et al., Scalable Framework for 3D FFTs on the Blue Gene/L Supercomputer: Implementation and Early Performance Measurements, *IBM J. Res, & Dev.*, 49(2-3): 457-464, 2005.
B. G. Fitch, A. Rayshubskiy, M. Eleftheriou, et al., Blue Matter: Strong Scaling of Molecular Dynamics on Blue Gene/L, IBM RC23888, Feb. 22, 2006.
B. G. Fitch, A. Rayshubskiy, M. Eleftheriou, et al., Blue Matter: Approaching the Limits of Concurrency for Classical Molecular Dynamics, IBM RC23956, May 12, 2006.
B. G. Fitch, A. Rayshubskiy, M. Eleftheriou, et al., Blue Matter: Strong Scaling of Molecular Dynamics on Blue Gene/L, IBM RC23688, Aug. 5, 2005.
M. Frigo and S. G. Johnson, The Design and Implementation of FFTW3, *Proceedings of the IEEE*, 93(2): 216-231, 2005.
R. S. Germain, B. Fitch, A. Rayshubskiy, et al., Blue Matter on Blue Gene/L: Massively Parallel Computation for Biomolecular Simulation, presented at 3rd IEEE/ACM/IFIP international conference on Hardware/software codesign and system synthesis (CODES+ISSS '05), New York, NY, 2005.
T. A. Halgren, MMFF VII. Characterization of MMFF94, MMFF94s, and Other Widely Available Force Fields for Conformational Energies and for Intermolecular-Interaction Energies and Geometries, *J. Comput. Chem.*, 20(7): 730-748, 1999.

(Continued)

*Primary Examiner*—Thai Phan
(74) *Attorney, Agent, or Firm*—Occhiuti Rohlicek & Tsao LLP

(57) ABSTRACT

A method for dynamics simulation involves maintaining quantities according to a floating point binary format quantized to a first precision lower than the precision supported by the floating point format. For example, although an IEEE floating point number can represent numbers with a precision of one part in $2^{24}$, the quantities are quantized to a lower precision, such as one part in $2^{22}$. Operations are applied to sets of the quantities by quantizing the intermediate results of the operations to the lower precision than the precision supported by the floating point format.

19 Claims, No Drawings

OTHER PUBLICATIONS

G. S. Heffelfinger, Parallel Atomistic Simulations, *Comput. Phys. Commun.*, 128(1-2): 219-237, 2000.

W. L. Jorgensen, D. S. Maxwell, and J. Tirado-Rives, Development and Testing of the OPLS All-Atom Force Field on Conformational Energetics and Properties of Organic Liquids, *J. Am. Chem. Soc.*, 118(45): 11225-11236, 1996.

S. Kumar, G. Almasi, C. Huang, et al., Achieving Strong Scaling with NAMD on Blue Gene/L, presented at IEEE International Parallel & Distributed Processing Symposium, Rhodes Island, Greece, 2006.

J. Liu, J. Wu, and D. K. Panda, High Performance RDMA Based MPI Implementation over InfiniBand, presented at $17^{th}$ International Conference on Supercomputing, San Francisco, CA, 2003.

J. MacKerell, A. D., D. Bashford, M. Bellott, et al., All-Atom Empirical Potential for Molecular Modeling and Dynamics Studies of Proteins, *J. Phys. Chem. B*, 102(18): 3586-3616, 1998.

P. Mark and L. Nilsson, Structure and Dynamics of Liquid Water with Different Long-Range Interaction Truncation and Temperature Control Methods in Molecular Dynamics Simulations, *J. Comput. Chem.*, 23(13): 1211-1219, 2002.

Mellanox Technologies, Mellanox IB-Verbs API (VAPI): Mellanox Software Programmer's Interface for InfiniBand Verbs, 2001.

T. Narumi, A. Kawai, and T. Koishi, An 8.61 Tflop/s Molecular Dynamics Simulation for NaCl with a Special-Purpose Computer: MDM, presented at ACM/IEEE SC2001 Conference, Denver, Colorado, 2001.

J. Norberg and L. Nilsson, On the Truncation of Long-Range Electrostatic Interactions in DNA, *Biophys. J*, 79(3): 1537-1553, 2000.

V. S. Pande, I. Baker, J. Chapman, et al., Atomistic Protein Folding Simulations on the Submillisecond Time Scale Using Worldwide Distributed Computing, *Biopolymers*, 68(1): 91-109, 2003.

P. M. Papadopoulos, M. J. Katz, and G. Bruno, NPACI Rocks: Tools and Techniques for Easily Deploying Manageable Linux Clusters, *Concurrency Comput. Pract. Ex.*, 15(7-8): 707-725, 2003.

M. Patra, M. Karttunen, T. Hyvönen, et al., Molecular Dynamics Simulations of Lipid Bilayers: Major Artifacts Due to Truncating Electrostatic Interactions, *Biophys. J.*, 84: 3636-3645, 2003.

J. C. Phillips, R. Braun, W. Wang, et al., Scalable Molecular Dynamics with NAMD, *J. Comput. Chem.*, 26(16): 1781-1802, 2005.

J. C. Phillips, G. Zheng, S. Kumar, et al., NAMD: Biomolecular Simulation on Thousands of Processors, presented at ACM/IEEE SC2002 Conference, Baltimore, 2002.

S. Plimpton, Fast Parallel Algorithms for Short-Range Molecular-Dynamics, *J. Comput. Phys.*, 117(1): 1-19, 1995.

S. Plimpton and B. Hendrickson, Parallel Molecular-Dynamics Simulations of Organic Materials, *Int. J. Mod. Phys. C.*, 5(2): 295-298, 1994.

S. Plimpton and B. Hendrickson, A New Parallel Method for Molecular Dynamics Simulation of Macromolecular Systems, *J. Comput. Chem.*, 17(3): 326-337, 1996.

W. R. P. Scott, P. H. Hünenberger, I. G. Tironi, et al., The GROMOS Biomolecular Simulation Program Package, *J. Phys. Chem. A*, 103(19): 3596-3607, 1999.

M. M. Seibert, A. Patriksson, B. Hess, et al., Reproducible Polypeptide Folding and Structure Prediction Using Molecular Dynamics Simulations, *J. Mol. Biol.*, 354(1): 173-183, 2005.

Y. Shan, J. L. Klepeis, M. P. Eastwood, et al., Gaussian Split Ewald: A Fast Ewald Mesh Method for Molecular Simulation, *J. Chem. Phys.*, 122: 054101, 2005.

D. E. Shaw, A Fast, Scalable Method for the Parallel Evaluation of Distance-Limited Pairwise Particle Interactions, *J. Comput. Chem.*, 26(13): 1318-1328, 2005.

M. Snir, A Note on N-Body Computations with Cutoffs, *Theor. Comput. Syst.*, 37: 295-318, 2004.

D. van der Spoel, E. Lindahl, B. Hess, et al., GROMACS: Fast, Flexible, and Free, *Journal of Computational Chemistry*, 26(16): 1701-1718, 2005.

M. Taiji, T. Narumi, Y. Ohno, et al., Protein Explorer: A Petaflops Special-Purpose Computer System for Molecular Dynamics Simulations, presented at ACM/IEEE SC2003 Conference, Phoenix, Arizona, 2003.

R. Zhou and B. J. Berne, A New Molecular Dynamics Method Combining the Reference System Propagator Algorithm with a Fast Multipole Method for Simulating Proteins and Other Complex Systems, *J. Chem. Phys.*, 103(21): 9444-9459, 1995.

R. Zhou, E. Harder, H. Xu, et al., Efficient Multiple Time Step Method for Use with Ewald and Particle Mesh Ewald for Large Biomolecular Systems, *J. Chem. Phys.*, 115(5): 2348-2358, 2001.

\* cited by examiner

NUMERICAL TECHNIQUES FOR DYNAMICS SIMULATION

CROSS-REFERENCE TO RELATED APPLICATIONS

This application claims the benefit of U.S. Provisional Application No. 60/827,547, filed Sep. 29, 2006, titled "NUMERICAL TECHNIQUES FOR DYNAMICSSIMULATION REVERSIBILITY," which is incorporated herein by reference.

This application is related to U.S. Provisional Application No. 60/827,539, titled "CONSTRAINT STABILIZATION," filed Sep. 29, 2006, and to U.S. application Ser. No. 11/865,262 titled "CONSTRAINT STABILIZATION," filed concurrently with the present application. These applications are incorporated herein by reference.

This application is also related to PCT Application No. PCT/US2006/032498, titled "ARCHITECTURES FOR COMPUTATION OF PARTICLE INTERACTIONS," filed on Aug. 18, 2006, which is incorporated herein by reference.

BACKGROUND

This invention relates to numerical techniques for dynamics simulation.

In principle, a dynamics simulation, such as molecular dynamics (MD) simulation can be time reversible because the classical equations of motion are time reversible. For example, if one runs an MD simulation for a thousand time steps, negates the instantaneous velocities for all particles, and runs for another thousand time steps, one should exactly recover the initial particle positions. However, many simulation software implementations fail to achieve reversibility for two reasons. First, roundoff error during integration leads to a loss of state information; particle positions and velocities at one time step cannot be exactly reconstructed from those at the next time step. Second, lack of associativity of floating point summation leads to a situation where computed forces can depend on various factors that affect order of summation, such that these forces are not uniquely defined by particle positions and force field parameters in an MD simulation.

Large floating point code, scalar or parallel, that ensures exact reversibility for non-trivial dynamics simulation runs is not known to the inventors.

SUMMARY

In one aspect, in general, a method for dynamics simulation involves maintaining quantities according to a floating point binary format quantized to a first precision lower than the precision supported by the floating point format. An operation is applied to a set of the quantities by quantizing the intermediate results of the operation to the lower precision than the precision supported by the floating point format.

In some examples, although an IEEE floating point number can represent numbers with a precision of one part in $2^{24}$, the quantities are quantized to a lower precision, such as one part in $2^{22}$.

Aspects may include one or more of the following features.

A precision is selected to be lower than the precision supported by the floating point format.

Selecting the precision includes dynamically varying that precision during the course of a dynamic:; simulation.

Varying the precision includes varying that precision according to a characteristic of a system being simulated in the dynamics simulation. For example, the characteristics may include a temperature at which the simulation is being performed, or a dimension of the simulation volume. For example, at a high temperature or at a large dimension, a relatively greater precision may be selected.

Selecting the precision includes selecting different precisions for different of the quantities.

At least some of the quantities are maintained such that during the dynamics simulation the values can exceed a determined range and are then represented at a lower precision than when quantized. For example, if the values do not exceed the determined range the simulation remains reversible, but when the values exceed the range, reversibility may be lost but the accuracy of the simulation is largely maintained thereby providing a graceful degradation of the characteristics of the simulation.

The maintained quantities include quantities that represent physical features of bodies in the dynamics simulation.

The maintained quantities comprise integer quantities.

The maintained quantities comprise quantities with fractional components.

The maintained quantities comprise both integer quantities and quantities with fractional components.

Quantizing the intermediate results comprises performing multiple addition and/or subtraction floating point operations.

Quantizing an intermediate result comprises sequentially adding and subtracting a floating point constant number.

Applying the operation comprises computing a quantity that exceeds a range in which quantities are exactly represented Supporting bitwise exact time reversed simulation using the maintained quantities.

Applying an operation to quantities maintained at the first precision and to quantities maintained at the second precision, including quantizing intermediate results of the operation.

Fixed point numbers are stored in a floating point representation transparently. For example, a fixed point number can be treated as a seemingly normal floating point number without need for special treatment or rescaling.

Fixed point number stored in a floating point representation are used as a hybrid fixed point/floating point number. For example, using fixed point arithmetic in the non-exceptional case while keeping the ability to accommodate exceptional out-of-fixed-point-range results gracefully and without loss of performance.

"Magic number" shifts perform fixed point rounding efficiently.

The above techniques are used to make a simulation time-reversible.

The above techniques are used to reconfigure the effective precision used in a simulation without loss of performance. Note that these techniques allow the precision of various quantities can be set independently (e.g., positions have 40-bit resolution and velocities are 31-bit resolution).

The numerical techniques described in the context of dynamics simulation can be applied to other computations, for example, where exact, repeatable, or reversible calculations are required.

In another aspect, a system includes computational modules that implement the steps of any of the methods set forth above.

In another aspect, software, which may be stored on a computer readable medium, includes instruction: for causing a data processing system to perform the steps of any of the methods set forth above.

Aspects can have one or more of the following advantages.

Reversibility can help ensure that an implementation will accurately model thermodynamic relationships that depend on detailed balance and can result in very low energy drift.

The numerical techniques described that can be used to provide bitwise reversibility are also applicable in situations in which bitwise reversibility is not strictly achievable for other reasons. MD simulations that employ constraints and that perform pair list updates infrequently or other such techniques may not be able to be rendered reversible by these techniques. Nevertheless, these techniques may be beneficial in those cases, resulting, for (example, in significantly lower energy drift. As another example, simulations using these numerical techniques can be made deterministic in a parallel implementation and/or not dependent on the order or other arrangement of the calculations involved.

As a technique for controlling energy drift, the numerical techniques described herein can be combined with constrain stabilization techniques described in the copending utility application "CONSTRAINT STABILIZATION." For example, the procedures outlined in the copending application can be implemented using the numerical techniques described herein to control precision of the computations.

Other features and advantages of the invention are apparent from the following description, and from, the claims.

DESCRIPTION

A new numerical technique for dynamics simulation can be used to preserve exact bitwise reversibility for simulations that do not use constraints and in which pairlist updating is performed at every time step. This approach is applicable to at least some MD integration schemes. In one embodiment, loss of information is avoided during integration by performing updates to particle coordinates using fixed point arithmetic. Problems due to non-associativity are avoided by maintaining a consistent ordering of the particles and computations such that computed forces are unique functions of the particle positions and force field parameters.

Consider a simple unconstrained NVE (constant particle number, constant volume, constant energy) simulation integrated with the velocity Verlet method (in general, in equations below the notation a_b denotes a subscript b and the notation a^b denotes a superscript b). Let:

F(X) be a function that produces the vector of forces given the vector of positions.

X_0 and V_0 be vectors that give all the particle positions and velocities at the beginning of a timestep.

DT be the timestep.

M be the particle mass matrix (and in the mass of particle i).

X_1 and V_1 be the positions and velocities at the end of a timestep.

Vectors like V_h anti so forth be computational intermediates.

The NVE velocity verlet algorithm to advance (X_0,V_0) to (X_1,V_1) can be expressed as:

$V\_h = V\_0 + M^{-1}F(X\_0)DT/2$ ... half advance velocities $X\_1 = X\_0 + V\_hDT$ ... advance positions $V\_1 = V\_h + M^{-1}F(X\_1)DT/2$ ... half advance velocities Suppose you nun this algorithm starting from (X_1,-V_1). It can be proved that algorithm advances this starting point to (X_0,-V_0) if done in exact arithmetic. That is, the above algorithm is time reversible in exact arithmetic. It is straightforward to show that the above is still reversible if the following properties hold for inexact arithmetic:

$(X+(VDT))+((-V)DT)=X$ $(-(V+(M^{-1}F(X)DT/2)))+(M^{-1}F(X)DT/2)=-V$

Above, all operations are done in the order implied by the parenthesis with the inexact operations. No assumptions have been made about the behavior of the inexact operations.

For standard IEEE floating point arithmetic, the above properties do not hold due to floating point non-associativity. That is (a+b)+c does not necessarily equal a+(b+c) in IEEE floating point, dramatically in situations in which b and c are much smaller than a.

Suppose the individual components of X and V can be bounded to be less than XMAX and VMAX respectively. This is relatively straightforward for most MD simulations. For example, periodic simulations already have a natural bound for particle positions (e.g., all particles reside within or near the simulation unit cell). Likewise, velocities can be strictly bounded in a constant energy simulation (e.g. for systems with a minimal potential energy configuration, a strict but overly conservative bound can be obtained by concentrating all the kinetic energy and excess potential energy into a single velocity component of the lightest particle). Much tighter, though often probabilistic, bounds can be found. quickly using thermodynamic arguments (e.g. VMAX is such that one should expect to wait several billion years before seeing a particle with such a large velocity).

With X's and V's components bounded, it is natural to represent X and V via vectors XI and VI whose components can take a finite number of integral values. For example, let XI and VI be vectors of conventional signed twos complement integers of bit width N_BX and N_BV respectively and X and V obtained from XI and VI from:

X=XIDX V=VIDV where:

$DX=XMAX/2^{(N\_BX-1)} DV=VMAX/2^{(N\_BV-1)}$

It can be proved that in such a representation, the following NVE equivalent integer math integrator is exactly reversible:

$XI\_h = VI\_0 + \text{ROUND}(M^{-1}F(X\_0)DT/(2DV))$ $XI\_1 = XI\_0 + \text{ROUND}(VI\_hDVDT/DX)$ $VI\_1 = VI\_h + \text{ROUND}(M^{-1}F(X\_1)DT/2DV))$ The operation ROUND( D ) above numerically rounds D (whose representation is arbitrary) to the nearest integer (with ties broken toward the even integer).

Implementation of simulation software using integer arithmetic can have one or more disadvantages. For example, most quantities of interest in MD are naturally represented as a floating point number. Furthermore, modern processors are typically heavily optimized floating point arithmetic. For example, support is provided for vectorizing floating point operations but little support is provided for vectorizing integer operations. Finally, mixing integer and floating point arithmetic is typically very slow, and operations such as ROUND and converting between floating point and integer numbers are very inefficient.

In another embodiment of a time-reversible simulation, deficiencies of an all-integer embodiment can be alleviated. The basic steps for constructing such a reversible unconstrained NVE integrator are detailed below.

First we store XI and VI as IEEE floating point numbers. Note that in a single precision IEEE floating point number, 1 bit is used for the sign, 8 bits are used to the exponent, e, (biased by adding 127), and 23 bits for the mantissa, f, (the fractional part of the significant, m). That is, m=1+f, and the floating point value is $2^e(1+f)$.

Using floating point representations for XI and VI can be done without loss of information if it is noted that IEEE single precision can exactly represent all integers whose magnitude is less than or equal to 2^24 because there are 23 bits of mantissa (with the most significant bit of the mantissa implied for normalized values) in the 32-bit floating point format. (This limit can be understood by considering the floating point representation of 2^24+1 as a single precision IEEE floating point number, which results in an exponent of 24, and a mantissa of 2^−24—but the mantissa has only a precision of 2^−23 so the fractional part is truncated to 0, which yields the same representation as 2^24.) Thus, this requires N_BX and N_BV to be less than or equal to 24. For double precision, the corresponding restriction is less than or equal to 53.

Next we note that IEEE floating point specifies that basic binary operations (+,−,*,/) between floating point numbers produce the floating point result closest to the exact result with ties broken to the "even" floating point number in non-exceptional cases. Since the additions in the integer based Verlet algorithm are between bounded representable integers and produce bounded representable integer results, IEEE rounding requires these operations be performed exactly. Thus, floating point non-associativity will not affect the addition operations in the NVE integer math integrator.

Next we note that between 2^23 and 2^24 in single precision (and 2^52 and 2^53 in double precision), the only numbers that can be represented are integers and that all integers in that range can be represented. If we restrict N_BX and N_BV to less than or equal to 23 for single precision (or 52 for double precision) and restrict the input to the ROUND operation lo less than 2^22 for single precision (or 2^51 for double precision) we can implement the ROUND operation with great efficiency. Namely, in single precision, if |D|<2^22

$$ROUND(D)=(D+(2^{23}+2^{22}))-(2^{23}+2^{22})$$

To explain, with the given restriction on D, the result of D+(2^23+2^22) is in interval [2^23,2^24]. All integers can be represented and only integers can be represented in this interval. Thus, the result of this operation must be ROUND(D)+(2^23+2^22) (exactly). Since, ROUND(D)+(2^23+2^22), (2^23+2^22) and ROUND(D) can all be represented exactly, the subsequent subtraction must be done exactly.

In short, this exploits floating point non-associativity to do integer rounding for us in just two normal IEEE adds or subtracts. Note that ROUND can be implemented almost as efficiently if the above additional restrictions are not met.

In another embodiment, if XMAX and VMAX are restricted to be powers of 2, then DX and DV are also powers of 2. So instead of multiplying and dividing the inputs to the ROUND operation by various factors of DX and DV, the algorithm can be written directly in terms of X and V with scale factors absorbed into a magic shift factors of the form VELOCITY_MAGIC=DV (2^23+2^22) and POSITION_MAGIC=DX (2^23+2^22).

Thus, if X_0 and V_0 are position of the form XI_0 DX and VI_0 DV and the various restrictions on ranges for positions, velocities and what not are met, the following algorithm produces correctly rounded X_1 and V_1 of the same form and is exactly reversible if implemented in IEEE floating point arithmetic:

$$X\_h = V\_0 + ((M^{-1}F(X\_0)DT + \text{VELOCITY\_MAGIC}) - \text{VELOCITY\_MAGIC})$$

$$X\_1 = X\_0 + ((V\_hDT + \text{POSITION\_MAGIC}) - \text{POSITION\_MAGIC})$$

$$V\_1 = V\_h + ((M^{-1}F(X\_1)DT + \text{VELOCITY\_MAGIC}) - \text{VELOCITY\_MAGIC})$$

That is at a cost of two adds per phase space component update, the conventional NVE algorithm is rendered exactly reversible and no other modifications are necessary algorithms that use this integrator.

A side benefit of this approach is that if any of the magnitude restrictions above are violated, the result is not catastrophic. The simulation will just not be fully reversible. Thus, exceptional results (abnormally large velocities for example) will be handled gracefully. (In practice, it is easy to insure that exceptional results occur so rarely that reversibility is maintained for any conceivable simulation.)

As an implementation issue, it is important that an optimizing compiler not recognize that an expression of the form y=(x+MAGIC)−MAGIC can be algebraically optimized at compile time to be equal to y=x. A number of engineering techniques can be used, including (1) using function calls MAGIC( ) that return the constant value, (2) introducing a procedure call in the following sequence $y = x + \text{MAGIC}$;

null_proc(&y);

$y = y - \text{MAGIC}$;

where null_proc( ) is a procedure that receives the address of y but takes no action before returning, but nevertheless preventing the compiler from combining the assignment statements to y, and (;3) using an explicit compiler directive that prevents the optimization, such as volatile float tmp[1];

tmp[0]=x+MAGIC;

y=tmp[0]−MAGIC;

which prevents the compiler from assuming that the value of tmp[0] doesn't change between execution of the two assignment statements.

In using these ideas in a parallel MD code, the evaluation of F(X) should give a result that is strictly a function of X. Because various calculations needed to compute F(X) are continually being reassigned and reordered among the nodes, floating point non-associativity may cause the calculation of F to depend on other factors. This can be avoided by maintaining a consistent ordering of the particles and computations such that computed forces are unique functions of the particle positions and force field parameters. For example, in a distributed implementation, a node may receive elements of the operand X, such as quantities associated with various particles, in an order that can vary from run to run of the simulation, or can differ in a forward time versus a reverse time timestep. By defining a canonical ordering of the operations for implementing F(X) based, for example, on the positions of the particles, the same computation is performed regardless of the order in which the elements of the operand are received.

Another approach to maintaining a consistent evaluation of F(X) is to make the relevant operations in the computation of F(X) resilient against such reorderings via the above rounding techniques (e.g. round the forces output by various computations to fixed point numbers as well).

Another reason for maintaining consistent evaluation of a function, such as F(X), is in a distributed implementation in which it may be preferable to perform various computations redundantly at two locations rather than exchange a result computed at one location. Although high numerical accuracy may be possible with a numerically small error, any difference in the values of F(X) computed at different location can cause significant errors. For example, if two processors compute F(X) and compare the value to a fixed threshold to determine whether to perform a certain computation, with the desired result being that one and only one of the processors performs that computation, even a small numerical difference near the threshold could result in no processor or two processors performing the computation. However, by using a technique to provide consistent evaluation of F(X), the consistency is maintained across space in the distributed system as well as across time.

In some examples, the precision of computation is not the same for all types of quantities. Similarly, the precision of a simulation to be reconfigured dynamically (i.e., with different precision at different time intervals, in different spatial regions, or for different types of quantities) without loss of efficiency. For instance, precision of computations can be adjusted according to characteristics of the computation system, or according to a state or other characteristics of the system being simulated. These ideas can also be used to investigate or assess the impact of precision on position, velocity, force and other MD variables on MD simulation quality without significantly degrading performance.

In some examples, the variables are allowed to exceed the "maximum" values in a hybrid approach. As long as the values are within the maximum, the precision is determined by the MAGIC values. If the values exceed the maximum value, the bitwise reversibility or other desirable properties may be lost or may not be guaranteed, but the computations can continue with only some degradation in numerical properties. Therefore, such a hybrid approach can provided desired numerical properties in typical situations while providing robustness if values exceed their typical ranges.

Other embodiments are within the scope of the appended claims.

APPENDIX

Below is software source code for an embodiment of the techniques described above.

```
/***********************************************************************
*
**
* POSITION PHASE SPACE FLOATING POINT REVERSIBILITY AND CACHE
COHERENCE
*
***********************************************************************
*
*/
/*   Do not touch this unless you really understand the floating point
     cache coherence voodoo magic and are well versed in IEEE-754
     standard, ANSI-C89 standard, POSIX-1 standard and common compiler
     and floating point compliance issues. */
/*   FLOAT32_INT_MAX is the float32 number that is equal to the largest
     exactly representable positive integer such that all positive
     integers smaller than FLOAT32_INT_MAX are also exactly
     representable. (Floating point adds and multiples performed on
     integers less than FLOAT32_INT_MAX in magnitude are performed
     _exactly_.) Note: In IEEE floating point, 2/FLOAT32_INT_MAX is
     equivalent to the ANSI-C "FLOAT32"_EPSILON. */
#ifndef FLOAT32_INT_MAX
# if FLOAT32_SIZE==4
#       define FLOAT32_INT_MAX (16777216.)
# elif FLOAT32_SIZE==8
#       define FLOAT32_INT_MAX (9007199254740992.)
# else
#       error "Unknown floating point format. Define FLOAT32_INT_MAX."
# endif
#endif
/*   POSITION_RESOLUTION is the number of representable positions across
     a homebox. Note in normalized coordinates, the homebox has unit
     length and the edges of the homebox are at +/- 0.5. For the
     midpoint method math and coordinate translation math to be
     reliable, this number must be a power 2 less than but not equal to
     FLOAT32_INT_MAX. This insures that any given coordinate of an owned
     particle can be exactly represented on its neighbors and that any
     borderline midpoints can be unambiguously resolved. */
#ifndef POSITION_RESOLUTION
#define POSITION_RESOLUTION (0.5*FLOAT32_INT_MAX)
#endif
/*   The interval [POSITION_WHITE_MAGIC,2*POSITION_WHITE_MAGIC] is the
     interval containing all positive floating point numbers such that
     the spacing between all exactly representable adjacent numbers in
     the interval is exactly 1/POSITION_RESOLUTION. POSITION_BLACK_MAGIC
     is the center of this interval. Given the restrictions on
     POSITION_RESOLUTION above, the smallest interval that might occur
     is [1,2] and the distance from the center to the edge of the
     interval is at least 0.5. */
#define POSITION_WHITE_MAGIC ( 0.5 *FLOAT32_INT_MAX/POSITION_RESOLUTION
```

```
)
#define POSITION_BLACK_MAGIC ( 0.75*FLOAT32_INT_MAX/POSITION_RESOLUTION
)
/*   INCREMENT_POSITION increment a rationalized position by an
     _arbitrary_ dx to the nearest rationalized position assuming:
     1. |dx| < 1/2 (no increments larger than half a homebox)
     2. X_old is a rationalized coordinate.
     3. |X_new| < 2 (the output position is within two homeboxes of the
     center of the current homebox)
     If these are true the operation is exactly (bit-level) reversible,
     the rounding is exactly symmetric and the output is a rationalized
     coordinate. If these are not true, the operation will still produce
     reasonable results but may not be reversible any more. However, if
     any of these are not true, the simulation is likely
     self-destructing due to numerical instability.
     How this works:
     Since |dx|<1/2 and the distance from POSITION_BLACK_MAGIC to the
     edges of the interval [POSITION_WHITE_MAGIC,2*POSITION_WHITE_MAGIC]
     is at least 1/2, the result forced assigment
            magic[0] = dx + POSITION_BLACK_MAGIC
     is in the interval
     [POSITION_WHITE_MAGIC,2*POSITION_WHITE_MAGIC]. In this interval,
     only numbers with the desired adjacent spacing can be represented.
     Since POSITION_BLACK_MAGIC is exactly representable in this range
     then, magic[0] is exactly set to:
            fixp_round_even(dx) + POSITION_BLACK_MAGIC.
     fixp_round_even(dx) can then be found as POSITION_BLACK_MAGIC can
     be exactly subtracted off this quantity to yield an increment to a
     rationalized position that will result in another rationalized
     position. This increment is also exactly reversible as
     fixp_round_even is symmetric under dx --> -dx. */
#define INCREMENT_POSITION(x,dx) BEGIN_PRIMITIVE {
\
     volatile float32 _magic[1];
\
     _magic[0] = (dx) + POSITION_BLACK_MAGIC;
\
     (x) += _magic[0] - POSITION_BLACK_MAGIC;
\
     } END_PRIMITIVE
```

What is claimed is:

1. A method for dynamics simulation comprising:
maintaining quantities according to a floating point binary format quantized to a precision lower than the precision supported by the floating point format; and
applying an operation to a set of the quantities by quantizing the intermediate results of the operation to the lower precision than the precision supported by the floating point format.

2. The method of claim 1, further comprising: selecting a precision lower than the precision supported by the floating point format.

3. The method of claim 2, wherein selecting the precision includes dynamically varying said precision during a dynamics simulation.

4. The method of claim 3, wherein dynamically varying the precision includes varying said precision according to a characteristic of a system being simulated in the dynamics simulation.

5. The method of claim 4, wherein the characteristic of the system includes at least one of a temperature of the system and a dimension of a simulation volume of the system.

6. The method of claim 2, further comprising selecting the precision includes selecting different precisions for different types of the quantities.

7. The method of claim 1, further comprising: maintaining at least some of the quantities such that, during the dynamics simulation, the values can exceed a determined range and are then represented at a lower precision than when quantized.

8. The method of claim 1, wherein the maintained quantities include quantities that represent physical features of bodies in the dynamics simulation.

9. The method of claim 1, wherein the maintained quantities comprise integer quantities.

10. The method of claim 1, wherein the maintained quantities comprise quantities with fractional components.

11. The method of claim 1, wherein the maintained quantities comprise both integer quantities and quantities with fractional components.

12. The method of claim 1, wherein quantizing the intermediate results comprises performing multiple addition and/or subtraction floating point operations.

13. The method of claim 12, wherein quantizing an intermediate result comprises sequentially adding and subtracting a floating point constant number.

14. The method of claim 1, wherein applying the operation comprises computing a quantity that exceeds a range in which quantities are exactly represented.

15. The method of claim 1, further comprising supporting bitwise exact time reversed simulation using the maintained quantities.

16. The method of claim 1, further wherein the quantities are maintained at multiple locations of a distributed system, and wherein the method comprises applying the operation at each of the multiple locations, including computing an exact same result of applying the operation at each of the locations.

17. The method of claim 1, further comprising applying an operation to quantities maintained at the first precision and to quantities maintained at the second precision, including quantizing intermediate results of the operation.

18. A computer readable medium having software comprising instructions for causing a processor to:
   maintain quantities according to a floating point binary format quantized to a precision lower than the precision supported by the floating point format; and
   apply an operation to a set of the quantities by quantizing the intermediate results of the operation to the lower precision than the precision supported by the floating point format.

19. A method for dynamics simulation comprising:
   performing a series of forward time steps of the simulation from an initial state to a final state; and
   performing a series of reverse time steps of the simulation from the final state to yield the exact initial state;
   wherein performing the series of forward time steps and performing the series of reverse time steps includes maintaining quantities according to a floating point binary format quantized to a precision lower than the precision supported by the floating point format, and
   applying operations to sets of the quantities by quantizing the intermediate results of the operation to the lower precision than the precision supported by the floating point format.

* * * * *